(12) United States Patent
Cornwall

(10) Patent No.: US 7,746,203 B2
(45) Date of Patent: Jun. 29, 2010

(54) THERMODYNAMIC CYCLES

(76) Inventor: Remi Oseri Cornwall, 152 Grierson Road, London SE23 INX (GB)

( * ) Notice: Subject to any disclaimer, the term of this patent is extended or adjusted under 35 U.S.C. 154(b) by 325 days.

(21) Appl. No.: 11/809,330

(22) Filed: May 30, 2007

(65) Prior Publication Data

US 2008/0297290 A1    Dec. 4, 2008

(51) Int. Cl.
*H01F 13/00* (2006.01)
*F25B 21/00* (2006.01)

(52) U.S. Cl. .................. 335/284; 335/217; 62/3.1
(58) Field of Classification Search .......... 335/217, 335/284; 62/3–1
See application file for complete search history.

(56) References Cited

U.S. PATENT DOCUMENTS

| | | | |
|---|---|---|---|
| 2,510,800 A | 6/1950 | Chilowsky | |
| 3,073,974 A | 1/1963 | Hob | |
| 4,064,409 A | 12/1977 | Redman | |
| 4,197,492 A | 4/1980 | Sato et al. | |
| 4,246,531 A | 1/1981 | Jordan | |
| 4,392,356 A | 7/1983 | Brown | |
| 5,105,096 A | 4/1992 | Waldschmidt et al. | |
| 5,457,595 A | 10/1995 | Baldwin | |
| 5,714,829 A | 2/1998 | Guruprasad | |
| 6,320,488 B1 | 11/2001 | Leupold | |
| 6,725,668 B1 * | 4/2004 | Cornwall | 335/217 |

FOREIGN PATENT DOCUMENTS

WO    00/64038    10/2000

OTHER PUBLICATIONS

Aharoni, *Introduction to the Theory of Ferromagnetism*, pp. 1-5, 12-19, 92-101 (1996).
Feynman, *The Feynman Lectures on Physics*, pp. 34-1-34-12, 35-1-35-12, 36-1-36-15, 37-1-37-13, 38-1, 39-1-39-12, 40-1-40-10, 41-1-41-10, 42-1-42-10, 43-1-43-10, 44-1-44-13, 45-1-45-9, 46-1-46-8 (1989).
Rosensweig, *Ferrohydrodynamics*, pp. 60-63, 162-175(1985).
Solomon, "Design of a Thermomagnetic Generator," *Energy Convers. Mgmt.*, vol. 31, No. 2, pp. 157-173 (1991).

* cited by examiner

*Primary Examiner*—Lincoln Donovan
*Assistant Examiner*—Bernard Rojas
(74) *Attorney, Agent, or Firm*—Klarquist Sparkman, LLP

(57) ABSTRACT

One embodiment disclosed herein is an apparatus for performing a thermodynamic cycle comprising: a sample that exhibits temporary magnetic remanence; and a magnetisation apparatus for magnetising the sample, wherein the magnetisation apparatus is operable, during a first part of the thermodynamic cycle, to produce a cyclically-varying magnetising field comprising a wavetrain of a single or plurality of consecutive cycles, and to remove the magnetising field from the sample during a second part of the thermodynamic cycle, wherein demagnetisation of the sample during the second part of the thermodynamic cycle causes the generation of an independent magnetic flux.

13 Claims, 10 Drawing Sheets

1→2 Heat rejection at constant T, fluid enters field

2→3 Heat addition at constant H

3→4 Heat addition at constant T, fluid leaves field

4→1 Heat rejection, H = 0

THERMODYNAMIC CYCLES

FIELD

The disclosed technology relates to thermodynamic cycles, and in particular relates to improved excitation schemes for inducing magnetic fluxes in a sample for certain types of thermodynamic cycles.

BACKGROUND

It has previously been proposed to use a sample having temporary magnetic remenance to perform a thermodynamic cycle in which a varying magnetic field is used to produce a magnetic flux in the sample during a first part of the cycle, with the field being removed during a second part of the cycle, leading to collapse of the magnetic domains in the sample and the creation of an independent magnetic flux. It has been proposed to use this principle to convert heat energy into electricity, and also for refrigeration.

An example of a system of this type is described in International Publication No. WO 00/64038 entitled "Thermodynamic Cycles and Method for Generating Electricity" and filed Apr. 19, 2000. The contents of WO 00/64038 are hereby incorporated by reference. In the document, an example of the field excitation apparatus is given as being produced by a rotating permanent magnet to produce a largely sinusoidally-varying field. High-permeability materials are placed in proximity to the sample to ensure that the rise and fall of the magnetic flux in the sample are very sharp compared to the overall cycle time, so that over each pulse the flux variation in the sample resembles a "top hat" function, rather than a sinusoidal wave.

Also, in use of the apparatus described in WO 00/64038, energy is recovered from the sample once per cycle of the excitation field. In a first step of the cycle, the sample is magnetised, with very little corresponding temperature rise, as the sample is far from the ferromagnetic phase transition point of the sample. The sample is then demagenetised by the removal of the field from the sample, after which the temperature of the sample falls as thermal energy within the sample is expended in working to re-randomise the domains in the sample against the field arising from the remnant magnetism of the sample. After a short time, heat from the surroundings warms the sample, and the magnetic domains within the sample become randomly oriented, and this leads to the generation of an independent magnetic flux as the magnetic field arising from the alignment of the magnetic domains collapses. This independent magnetic flux delivers power to the field generation apparatus.

SUMMARY

Disclosed below are representative embodiments of methods, apparatus, and systems that should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

In one exemplary embodiment of the disclosed technology, an apparatus for performing a thermodynamic cycle is disclosed. The exemplary apparatus comprises: a sample that exhibits temporary magnetic remenance; and a magnetisation apparatus for magnetising the sample, wherein the magnetisation apparatus is operable, during a first part of the thermodynamic cycle, to produce a cyclically-varying magnetising field comprising a wavetrain of a single or plurality of consecutive cycles, and to remove the magnetising field from the sample during a second part of the thermodynamic cycle, wherein demagnetisation of the sample during the second part of the thermodynamic cycle causes the generation of an independent magnetic flux.

In certain desirable embodiments, the cyclically-varying magnetising field is a substantially sinusoidally-varying magnetising field. Preferably, the magnetising field produces a substantially sinusoidally-varying magnetic flux in the sample. The sample can be, for example, a ferrofluid or ferroset with heat conduction channels therethrough. In some embodiments, the wavetrain comprises at least five consecutive cycles of the magnetising field (e.g., at least ten consecutive cycles of the magnetising field). In certain embodiments, the magnetisation apparatus also comprises a power collection apparatus, in which power is generated during the second part of the thermodynamic cycle by the independent magnetic flux.

In another exemplary embodiment, a method of converting energy is disclosed. The exemplary comprises: providing a sample that exhibits temporary magnetic remenance; magnetising the sample, during a first part of a thermodynamic cycle, by producing a cyclically-varying magnetising field comprising a wavetrain of a plurality of consecutive cycles; and removing the magnetising field from the sample during a second part of the thermodynamic cycle, thereby allowing the sample to demagnetise, the demagnetisation of the sample causing the generation of an independent magnetic flux. In certain embodiments, the method further comprises the step of converting at least some of the independent magnetic flux into an electric current.

In another exemplary embodiment, an apparatus for performing a thermodynamic cycle is disclosed comprising: a sample that exhibits temporary magnetic remenance; and a magnetisation apparatus for magnetising the sample, wherein the magnetisation apparatus is operable, during a first part of the thermodynamic cycle, to produce a substantially sinusoidally-varying magnetising field, thus producing a substantially sinusoidal variation of magnetic flux in the sample, and to remove the magnetising field from the sample during a second part of the thermodynamic cycle, wherein demagnetisation of the sample during the second part of the thermodynamic cycle causes the generation of an independent magnetic flux. The sample can be, for example, a ferrofluid or a ferroset with heat conduction channels therethrough.

In a further exemplary embodiment, another method for converting energy is disclosed. The exemplary method comprises: providing a sample that exhibits temporary magnetic remenance; magnetising the sample, during a first part of a thermodynamic cycle, by producing a substantially sinusoidally-varying magnetising field, thus producing a substantially sinusoidal variation of magnetic flux in the sample; and removing the magnetising field from the sample during a second part of the thermodynamic cycle, thereby allowing the sample to demagnetise, the demagnetisation of the sample causing the generation of an independent magnetic flux. In certain embodiments, the method further comprises the step of converting at least some of the independent magnetic flux into an electric current.

The foregoing and other objects, features, and advantages of the invention will become more apparent from the following detailed description, which proceeds with reference to the accompanying figures.

DETAILED DESCRIPTION

It is well known that ferrofluids display temporary magnetic remenance. See, e.g., Amika Aharoni, *Introduction to the Theory of Ferromagnetism* (Oxford Science Publications 1996) ("Aharoni"); R. E. Rosensweig, *Ferrohydrodynamics* (Cambridge University Press) ("Rosenweig"). Utilisation of this phenomenon to form a cyclical heat engine by 2nd order phase transitions of temporary remenance (as exemplified by ferrofluids) is preferred over magneto-calorific cycles. See, e.g., Remi Cornwall, International Publication No. WO 00/64038 entitled "Thermodynamic Cycles and Method for Generating Electricity" and filed Apr. 19, 2000. The independent flux criterion was highlighted as an aspect in the operation of the cycles by electrical means, though mechanical means of cycling the field are possible. See id. Appendix 1 below shows a test circuit and data illustrating the independent flux criterion. Appendix 2 below provides further details of embodiments of the disclosed technology using temperature-entropy and magnetization-temperature diagrams.

The independent flux criterion is a statement that the ferrofluid is magnetised and the magnetising current is off. Coupling of the power output coils whilst the magnetising current is still flowing results in transformer action. See, e.g., R. P. Feynman, *The Feynman Lectures on Physics*, Vol. 2, (Addison-Wesley, Reading, Mass. 1989) ("Feynman"). Nevertheless, several measures of the criterion have been developed:

The equivalent voltage source for the independent flux appears very stiff. See id. A dependent flux is merely transformer action and the impedance of its equivalent voltage source is the magnetising current/voltage source transformed. The independent flux is a source of power from outside the electrical system—i.e. generator action.

Figure 7:
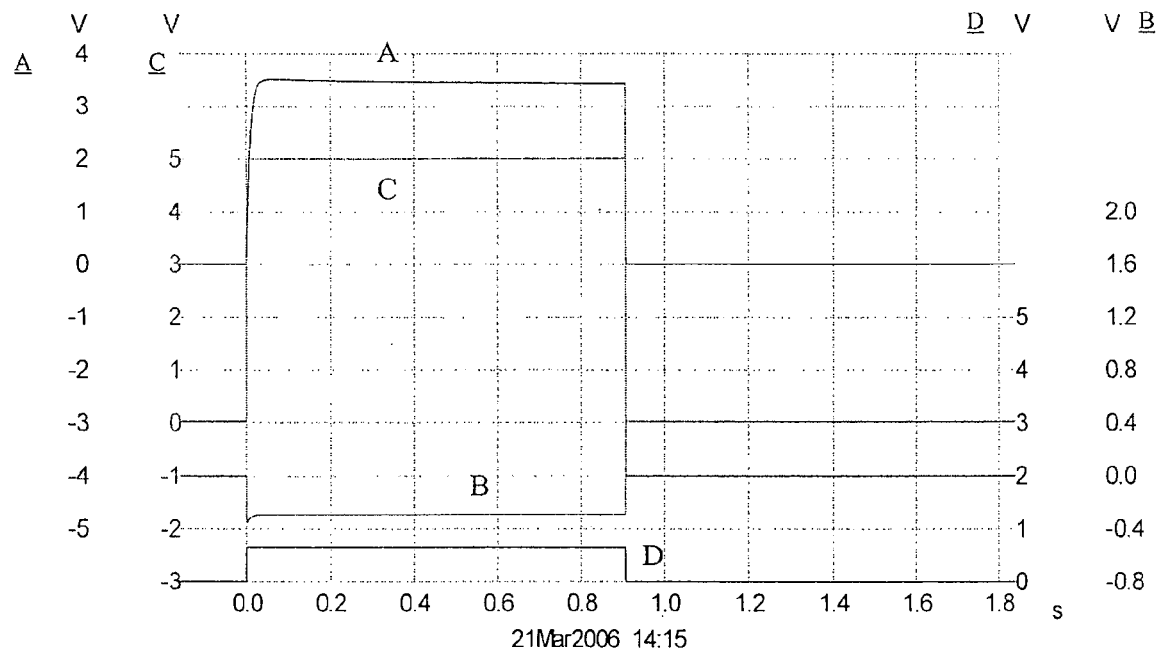
FIG. 7 shows two displays of a four channel oscilloscope during operation of the apparatus of FIG. 6. The lower display shows the traces of the upper display with a faster time base.
Figure 7:
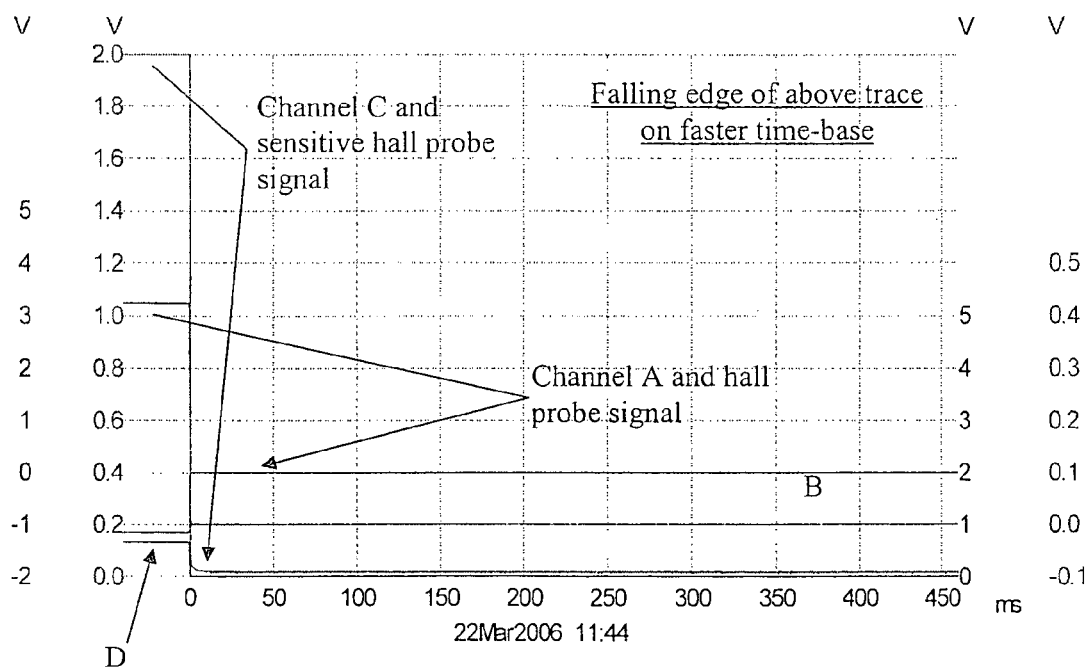

On considering the difference in the flux decay rate of an air core and then with the ferrofluid as the core, the change in the field time constant cannot be considered as being due to an increase in inductance, the susceptibility is too low (see appendix 1, FIG. 7).

Figure 8:
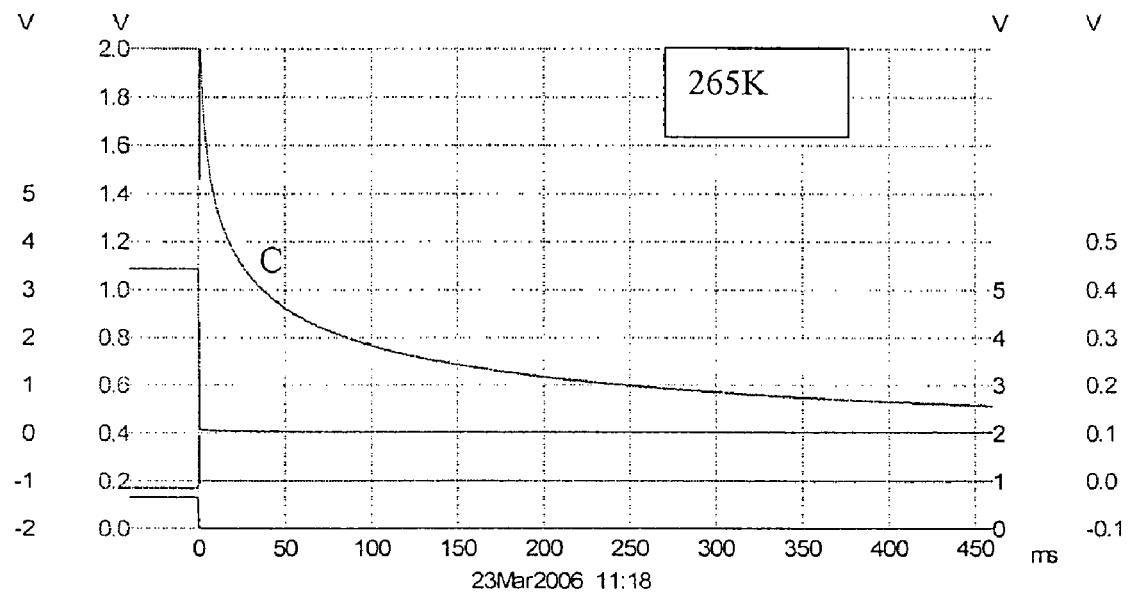
FIG. 8 shows two displays of the four channel oscilloscope during operation of the apparatus of FIG. 6 when a ferrofluid is inserted in the coil at different temperatures.
Figure 8:
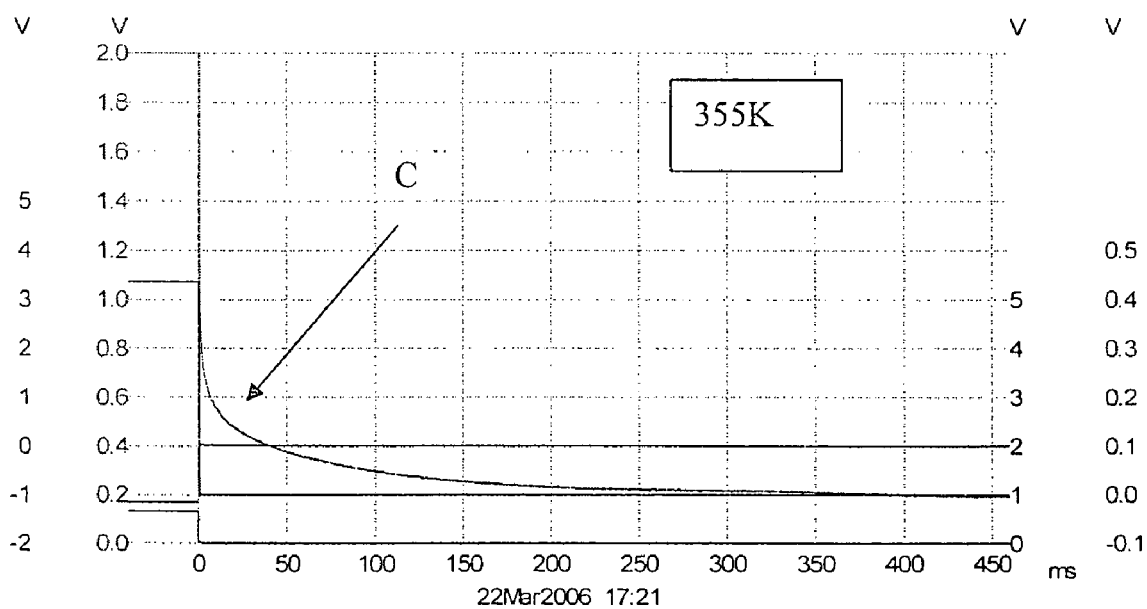

Flux decay rate vs. temperature (see appendix 1, FIG. 8). The ferrofluid is composed of domain sized ferromagnetic particles and the variation with temperature cannot be explained by changes in the magnetic moment below the Curie temperature (some hundreds of Kelvin)—this is a thermal relaxation effect cause by Néel or Brownian mechanisms. See, e.g., Aharoni; Rosensweig.

Explicit current/field measurement (see appendix 1, FIG. 9) showing that the magnetising current/field is off leaving the remnant magnetisation.

Ferrofluid relaxation is well modelled by a first order pole characteristic of exponential decay. See e.g., Aharoni. Earlier concerns for the field regenerator concentrated on forming half sawtooth pulses. The slow rise time ensured minimal dissipation in the fluid whilst the rapid switch off allowed maximum power generation from the independent flux condition.

The power input to magnetise the fluid and that developed by the flux collapse are given below:

$$P_{field} = -\xi \varepsilon_0 c^2 B_f^2 FV \quad (1)$$

$$P_f = \frac{kn^2}{R} V^2 Bf \frac{dBf}{dt} F \quad (2)$$

See, e.g., WO 00/64038. Another field term arises ($P_{mag}$) in much the same form for the electromagnet but it would be possible in future designs to bring together both the electromagnet, high permeability materials and the ferrofluid as one electromagnet unit and the objective in general would be to recoup as much of this field energy on cyclical operation, the factor $\zeta$ (the efficiency of recouping) would be small.

Dissipation in the ferrofluid by the said first order pole could potentially thwart all effort at recovering this field energy as it is a frequency dependent effect. The efficiency factor can be written as:

$$\xi = \xi_{FR} \xi'(f) \text{ and } \xi'(f) = \omega \tau_R \quad (3)$$

It is composed of two terms $\zeta_{FR}$ which represents the recovery by the power electronics of the field energy (shown for simplicity as being independent of frequency) and $\zeta'(f)$ which arises from the characteristic of the ferrofluid: it is the ratio of real (hence inductive) to imaginary (hence resistive) parts of the ferrofluid frequency response—in short the power factor or phase angle. Thus at low frequency $\zeta'(f)$ is low and much of the field energy could be recouped. In general to model the effect of a non-sinusoid on the ferrofluid the Fourier coefficients would determine $\zeta'_f$ and the amount of field energy at that frequency.

Exemplary embodiments of approaches to field generation and field regeneration according to the disclosed technology will now be described. It is an easy matter to form a high Q circuit that would naturally cycle field energy between the storage capacitor and electromagnet/inductor. At some point the field must be switched off and this too is an easy matter by the natural commuting action of a thyristor, for example. The objective then is to generate a short burst of magnetising sinusoids to which the ferrofluid would respond attenuated (the frequency dependency) and phase shifted.

On switch off of the magnetising sinusoid, the phase shifted ferrofluid waveform would then decay exponentially giving the independent flux. Operation at higher frequency would ensure more phase shift, more decaying ferrofluid flux and thus more power but added to this consideration is the lessening response at high frequency and the increased dissipation of the fluid. A mathematical model of this behaviour is described below.

Let the magnetising field be represented thus: $B_e \sin \omega t$. The response of the ferrofluid (to a good approximation) is a function of the frequency dependent susceptibility as a first order pole:

$$B_f = B_e \chi(\omega) \sin \omega t \qquad (4)$$

$$= \frac{B_e \chi_0}{\sqrt{(1 + \omega^2 \tau_R^2)}} \sin(\omega t - \tan^{-1} \omega \tau_R)$$

$$= \frac{B_e \chi_0}{\sqrt{1 + \frac{f^2}{f_R^2}}} si$$

Where concerning the ferrofluid: $f_R$ is the relaxation frequency, $\tau_R$ is the relaxation time constant, $\chi_0$ is the dc susceptibility of the ferrofluid, and f is the frequency of cycling of the magnetising field.

The remanence on switch off of the magnetising field is obtained by setting the $2\pi ft$ factor to zero. Substituting this amended equation into Equation 2:

$$P_f = \pi \frac{kn^2}{R} V^2 B_e^2 \chi_0^2 \frac{f^2 \cdot f_R^2}{(f^2 + f_R^2)} \sin\left(2\tan^{-1} \frac{f}{f_R}\right) \qquad (5)$$

Figure 2:
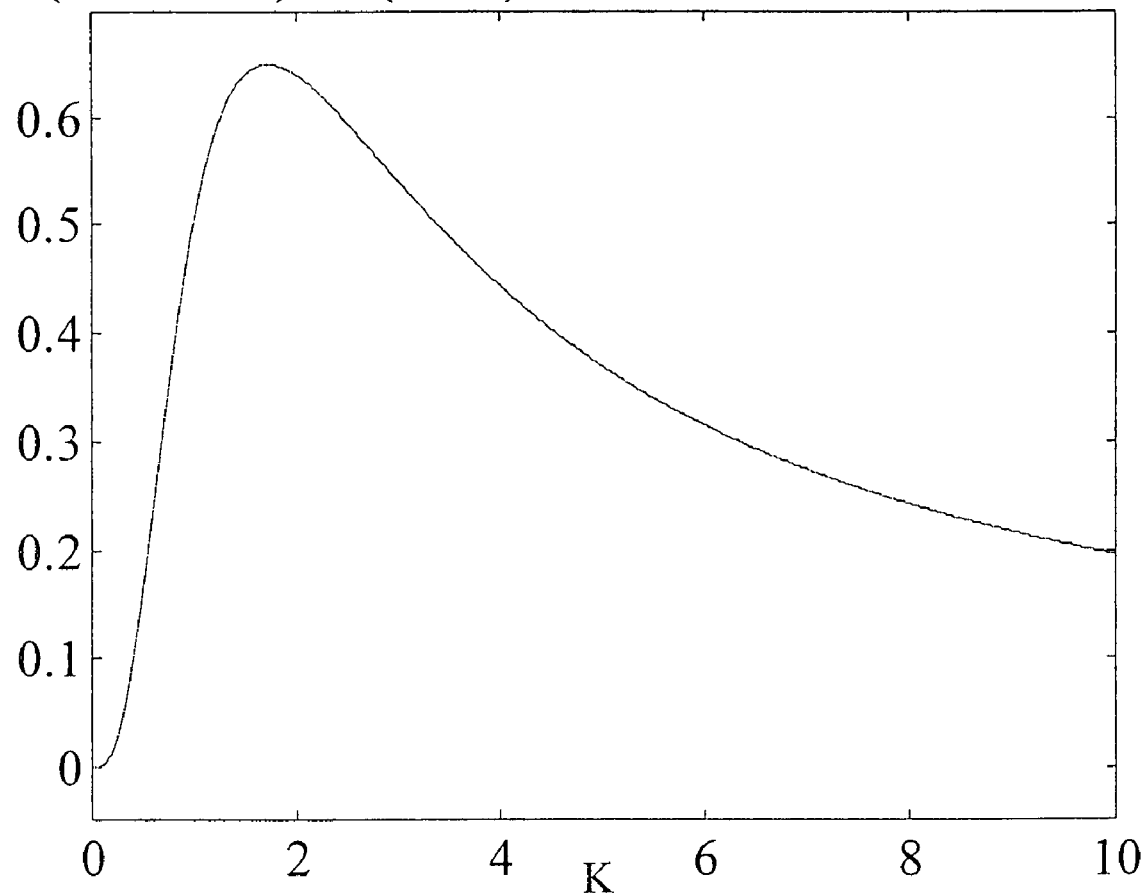
FIG. 2 is a plot of the normalized frequency terms of Equation 5.

Writing $f = k f_R$ so that k becomes the frequency variable and normalising the frequency of relaxation, $f_R$ to 1 Hz, the last two factors are plotted in FIG. 2. This predicts that maximum power generation will occur if the rate of cycling is nearly twice the relaxation frequency.

Figure 3:
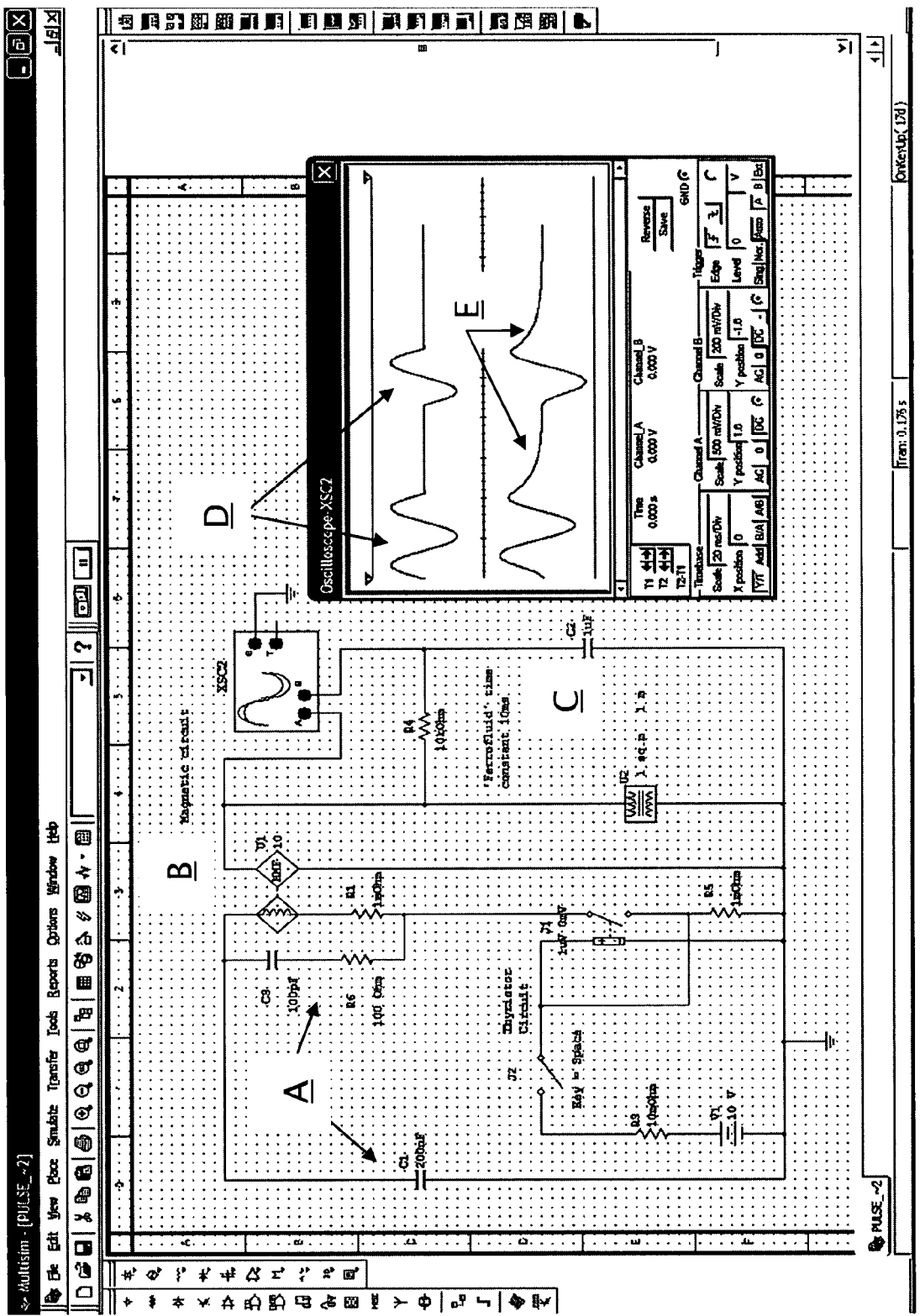
FIG. 3 shows a PSpice simulation of the magnetic field generated, and the flux produced, during a cycle according to an embodiment of the disclosed technology.

FIG. 3 shows a PSpice simulation of an exemplary approach to the field regenerator (at A and B) and a magnetic circuit analogue of the ferrofluid (at C). The exemplary LCR circuit illustrated in FIG. 3 has a capacitance of 200 nF in parallel with an inductance of about 130 H and a small stray capacitance of 100 pF in series with 100Ω. The particular values are not important and may reflect the choice of values in making a physically large power producing unit with extremely slow ferrofluid (time constant 100 ms, at C).

Depicted on the oscilloscope of the simulation is the magnetising sinusoid wavetrain (shown at D, which can even be a single wavelet) and the ferrofluid response (shown at E) which is phase shifted. On switch off of the magnetising field the independent ferrofluid flux decays exponentially. A few further points can be made:

Although not shown on the simulation, the RC network modelling the ferrofluid decay rate would be buffered by an amplifier and fed-back into the magnetic circuit showing power conversion from an external source into the electrical system. The explicit representation of this power as another voltage source would be read as micromechanical 'shaft-work' i.e. thermoelectric conversion.

Figure 4:
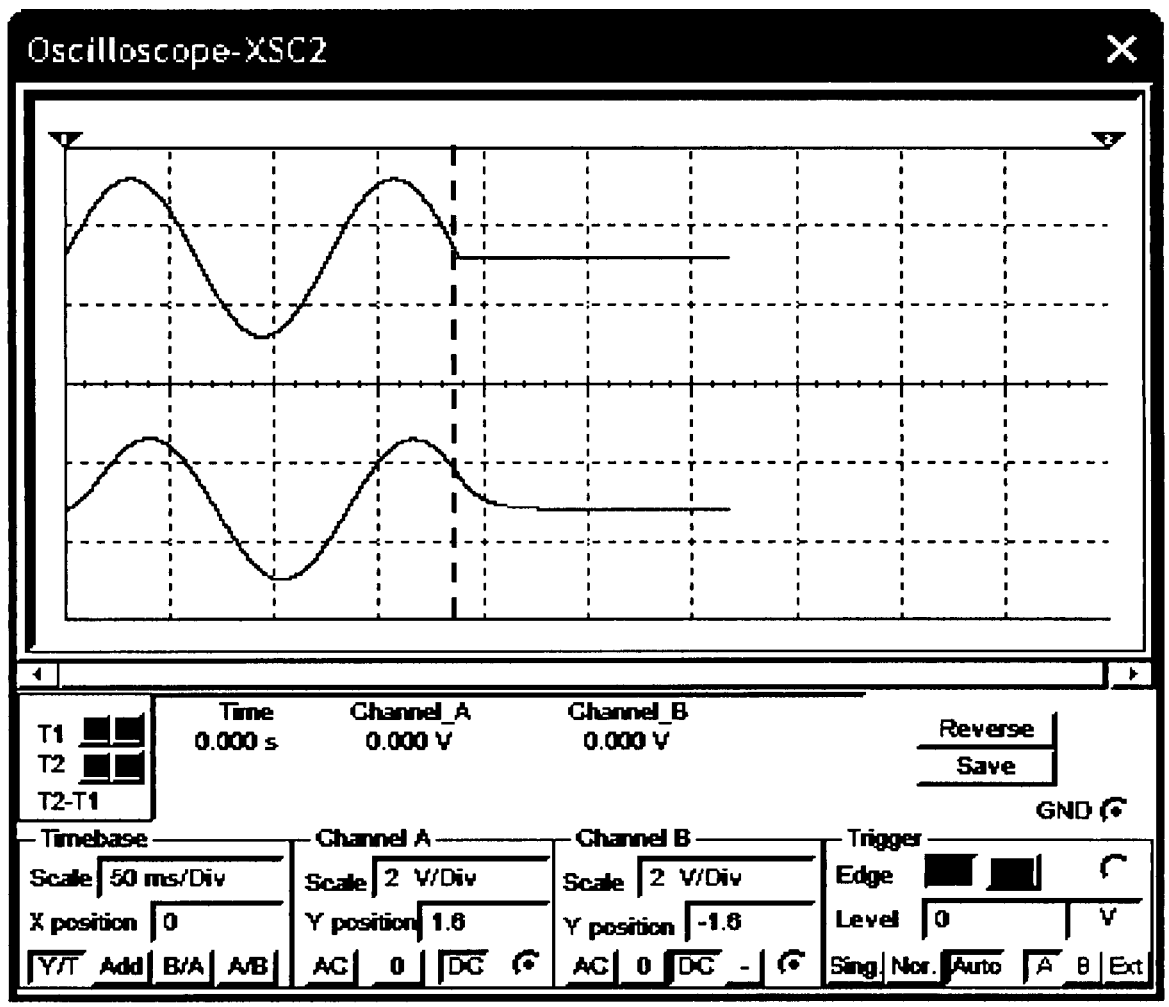
FIG. 4 shows a corresponding PSpice simulation when a lower excitation frequency is used.

Operating at too low a frequency for the ferrofluid results in little phase shift and hence little independent flux. As predicted by Equation 5 (FIG. 2) power generation tails off at low frequency. FIG. 4 shows the same simulation with a lower excitation frequency.

It is possible to use mechanical means for magnetic excitation and for large primal power scale applications the techniques of rotating electrical machines could be used.

The stray capacitance of the coil ($C_3$) should be small so that on current commutation most of the electrical energy for the oscillator would go back to the storage capacitor ($C_1$), otherwise the electromagnet will 'ring' and waste power.

Although thyristors are naturally self-commutative, a more ohmic commutating switch could be made with FETs. This would allow the LCR exciter to free-run for longer before requiring boosting.

The cycle (shown in FIG. 3 at E) can be operated with remnant or residual flux to achieve greater power. Since the power output is proportional to the rate of change of the field squared, most of the power comes in the first time constant of field decay. Modelling the flux decay by $e^{-t/\tau}$ (where $\tau$ is the ferrofluid time constant) and integrating this expression for time $t = n\tau$, the following energy is obtained:

$$E \propto \int_0^{n\tau} e^{-2t/\tau} dt = \frac{\tau}{2}(1 - e^{-2n}) \qquad (6)$$

The process happens in a cyclical manner with first a magnetisation step, then the demagnetisation power step. The optimum magnetisation time has already been found at $0.5\tau$ (FIG. 2) and so the power is then the energy divided by the time $(0.5+n)\tau$:

$$P(n) = \frac{(1 - e^{-2n})}{(1 + 2n)} \qquad (7)$$

Figure 5:
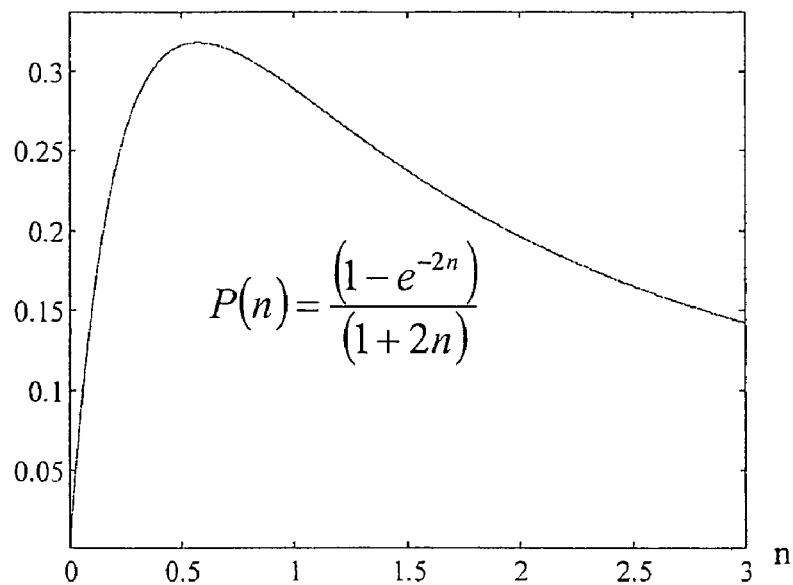
FIG. 5 shows a plot of power as a function of n, for a cycle according to an embodiment of the disclosed technology where n is the number of cycles occurring during a magnetisation step.

FIG. 5 shows a plot of power as a function of n. Thus it is generally better to let the field decay for only about a half time constant and then run the cycle again. Consider a magnetisation-demagnetisation cycle of $0.5\tau$ magnetisation and $5\tau$ demagnetisation (the $0.5\tau$ wavetrain frequency from FIG. 2); dropping the demagnetisation time to $0.5\tau$ gives a total cycle time of $1\tau$ compared to $5.5\tau$. Power ($1\tau = 63\%$ Energy) is dumped into the load 5.5 more times per unit time compared with ($5\tau = 99\%$ Energy) over 1 unit time, thus an increase in power of approximately 3.5 is possible with this scheme.

To summarise the exemplary cycle, during a first portion of the cycle a cyclical magnetising field is applied to the sample, and a plurality of cycles of the field are performed as part of the first cycle. Then, during a second portion of the cycle, the magnetising field is removed and the sample demagnetises, causing the generation of an independent magnetic flux. This exemplary approach allows the ferrofluid to respond, during the second part of the cycle, in a phase shifted manner, leading to more decaying ferrofluid flux and greater power. In certain embodiments of the disclosed technology, at least one wavetrain is produced.

In certain desirable embodiments of the disclosed technology, a substantially sinusoidal flux is generated in the sample. As discussed above, in the design of previous excitation apparatuses, a substantially sinusoidal field has been generated, but the flux generated in the sample has been influenced to be more akin to a top hat function, by the addition of high permeability materials near the sample. However, generating a substantially sinusoidal flux in the sample has benefits in that it is far easier to make a regenerative LCR circuit, as the circuit may "ring" at its resonant frequency during the cycle, thus minimising power losses.

As used in this disclosure, the term "comprises" means "includes" and "comprising" means "including." Furthermore, the features in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realizing the disclosed technology in diverse forms thereof.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the claims below and their equivalents. I therefore claim as my invention all that comes within the scope and spirit of these claims.

Appendix 1

Figure 6:
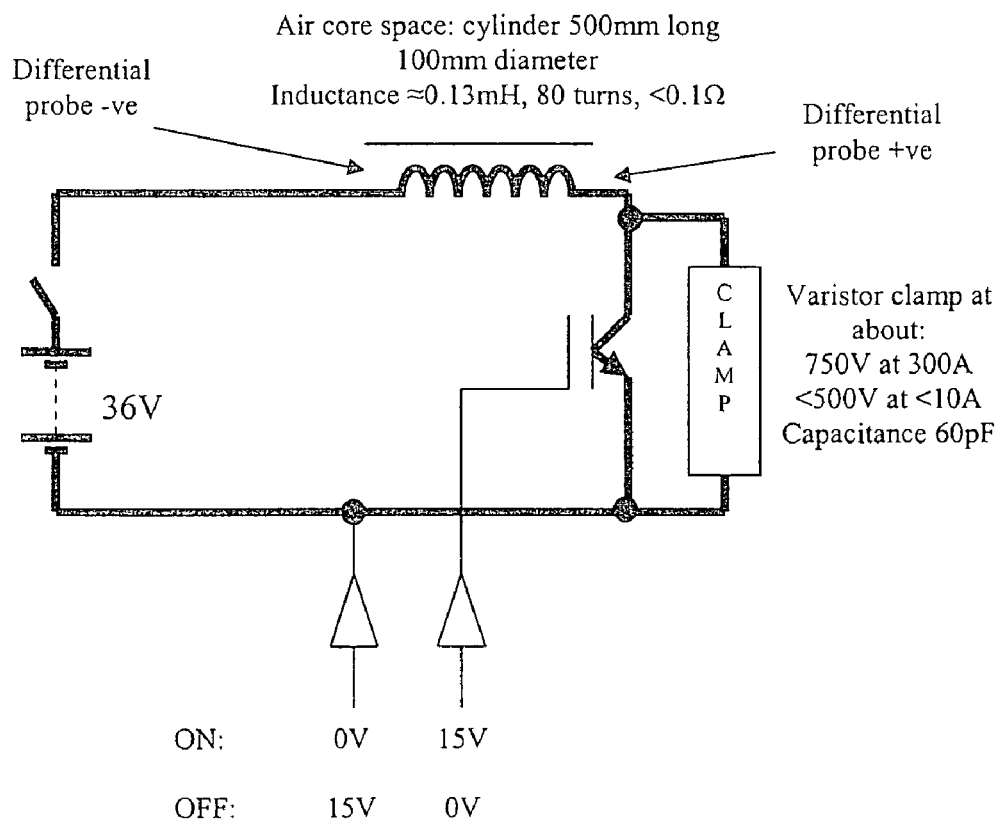
FIG. 6 shows a schematic block diagram of an exemplary apparatus used to test and analyze aspects of the disclosed technology.

FIG. 6 is a schematic block diagram showing a test apparatus used to perform the first phase of the project, the test of the independent flux criterion or put more simply, whether ferrofluids display temporary remenance. In one example, a current through the solenoid of about 1000 A generated a field of 1850 G in the centre and 810 G at the extremities.

FIG. 7 shows the apparatus in operation. On a four channel oscilloscope:

Channel A is the output from a hall-probe 2 mv/G

Channel B is the differential probe across the coil (FIG. 6) Voltage/100V

Channel C is the output from a more sensitive hall-probe 25 mv/G

D is the control line voltage to the IGBT attenuated 20:1

Clearly the lower trace on FIG. 7 shows that the magnetising field is switched off very rapidly in the order of sub-milliseconds. Consider now the traces in the two displays shown in FIG. 8 when a ferrofluid (batch F1027A Liquids Research, UK) is inserted in the coil at different temperatures (here, 265 K and 355 K)

The first point is to notice the small susceptibility, the magnetising field was about 1800 G and the induced flux was about 80 G so $\chi \approx 0.04$. The total field in the coil is given by: $B_{total} = B_e + B_f$, where $B_e$ is the magnetising or exciter field and $B_f$ is the induction of the ferrofluid. The ferrofluid looks practically like an air core yet the time constant for $B_f$ the remnant flux has gone from milliseconds to 100s of milliseconds. This cannot be explained by the core material of the solenoid somehow boosting the inductance of the coil—that would need a permeability of hundreds. It also would affect $B_e$ (the magnetising field) too and not just $B_f$.

The second point is that the ferrofluid is composed of domain sized ferromagnetic material far below the Curie point. An inductor whose core was made of such material would not show temperature related permeability change. It can only be that the rate of relaxation change is related to Brownian or Néel relaxation mechanisms. See, e.g., Aharoni, Rosensweig.

Figure 9:
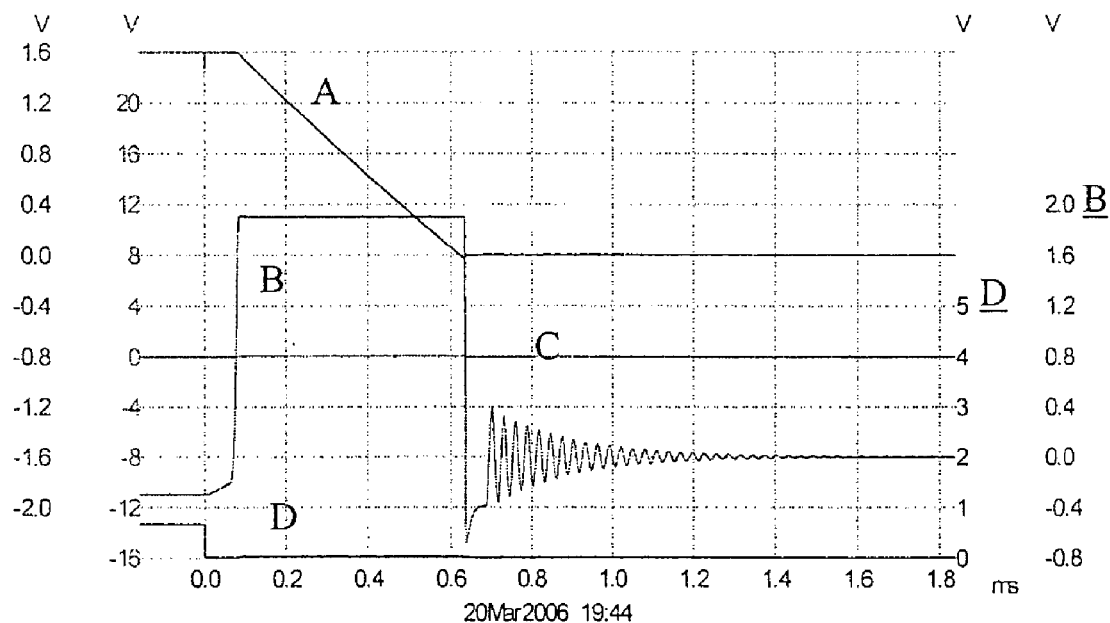
FIG. 9 shows a display of the four channel oscilloscope during operation of the apparatus of FIG. 6 at switch off.

FIG. 9 shows an implicit current measurement of current through the coil by measuring the voltage directly across it at switch off. The varistor clamps pin this voltage to about 200V (FIG. 6) whilst the hall-probe shows the field slewing in a linear manner as it must do by the relation E=−Ldi/dt. The rate at which the field switches off is within 0.6 ms. The ringing on the channel B waveform occurs when the electromagnet is open circuit. This ringing current is exceedingly small as the sensitive hall probe on channel C (FIG. 7) has not picked up the small magnetic field from it. It must be less than 1 G as 2V on the sensitive probe corresponds to 80 G.

Appendix 2: Observations About the Differences Between Carnot Heat Engines and Phase Changing Heat Engines In this section, the concept of 'making the differential inexact around a cycle' is discussed in further detail. See, e.g., WO 00/64038. From a graphical view of the process on a pressure-volume diagram (or similar), intuition into the two methods and their differences is gained. The matter is then discussed with magnetic methods using temperature-entropy and magnetization-temperature diagrams.

Conventional Carnot Theory

Consider the general thermodynamic identity:

$$dU = \delta Q + \delta W \Rightarrow$$

$$dU = TdS - PdV + HdI + \mu(n, P, T, \phi) \quad (A2.1)$$

The contributions of pressure volume and magnetic work (field strength H and moment I) are shown. The chemical potential is shown as a function of the amount, the pressure, the temperature and the potential energy of the substance. The focus is on cyclical devices meaning that the thermodynamic co-ordinates of the working substance are the same at the start and end of the cycle, so dU=0. The conventional Carnot view is that this can only happen between two reservoirs giving the work as the net difference between the heat absorbed from the upper reservoir and rejected into the lower reservoir:

$$W = Q_H - Q_L \quad (A2.2)$$

This is accomplished by the 'work terms' P(T, . . . ) or H(T, . . . ) and the like. The terms are shown as functions of the most important variable and others not listed by the ellipsis to reflect non-ideal effects. By a series of operations the working substance is transformed to effect Equation (A2.2), that is:

$$W = \sum_{i=1}^{n} P(T_i) dV$$

or $$W = \sum_{i=1}^{n} H(T_i)$$

where i is an index for the steps. An example is the idealised Carnot cycle shown in FIG. 10 which is completed by two reversible adiabatic and isothermal processes.

Figure 10:
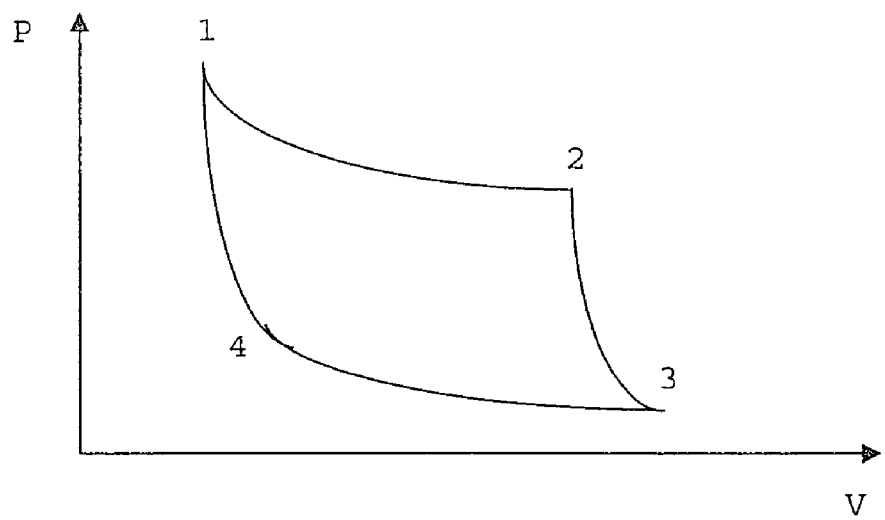
FIG. 10 shows a pressure-volume (P-V) diagram of an idealised Carnot cycle.

Referring to FIG. 10, the following steps can be identified:
Step 1-2: Isothermal expansion. $Q_H = W_{1-2} = \int PdV = mRT_H \ln(V_2/V_1)$
Step 2-3: Adiabatic expansion. $Q_{2-3} = 0$
Step 3-4: Isothermal compression. $Q_L = -W_{3-4} = -mRT_L \ln(V_4/V_3)$
Step 4-1: Adiabatic compression. $Q_{3-4} = 0$ For adiabatic processes, temperature can be related to volume and the compressibility factor of the gas:

$$\frac{T_L}{T_H} = \left(\frac{V_2}{V_3}\right)^{k-1} \frac{T_L}{T_H} = \left(\frac{V_1}{V_4}\right)^{k-1}$$

Thus:

$$\frac{V_1}{V_2} = \frac{V_4}{V_3}$$

The efficiency after eliminating $$V: \eta = \frac{Q_H - Q_L}{Q_H} = 1 - \frac{T_L}{T_H}$$

Incidentally this result applies for all engines operating between two reservoirs because the result is independent of properties of the working substance and only relates to the reservoirs.

In a sense, this result can be explained by Equation (A2.2)'s summations and FIG. 10 (the area between the lines is the work): it doesn't sum to zero because 'adiabatics are steeper than isothermals' by the popular maxim. Movement on the PV diagram is constrained by a family of curves: adiabatics, polytropics and isothermals. Adiabatics are desirably alternated with isothermals to get the path to map out an area on the PV diagram in a cyclical process, otherwise one just 'comes back the way they came' and achieves nothing (polytropics are a combination of adiabatic and isothermal processes). Thus with this viewpoint two reservoirs are needed.

Obtaining Work from One Thermodynamic Reservoir

The conventional heat engine theory has been summarised but the thermodynamic identity (Equation (A2.1)) affords another method of building a cyclical heat engine. The 'trick' of the heat engine is to sweep out an area between the trajectory of thermodynamic variables in a P-V or H-I diagram (etc.), the working substance comes back to initial conditions (dU=0) to complete the cycle. The implication of the Carnot result is that the working substance can only come back to initial co-ordinates after absorbing heat energy from the upper reservoir by rejecting some heat energy to the lower reservoir. The working substance is 'forced' around the trajectory by external influence of the two reservoirs (placing it in thermal contact). Merely cycling the thermodynamic co-ordinates of the working substance alone, in isolation (say along an adiabatic) would achieve nothing useful.

One exemplary manner of getting the trajectory to 'jump off' the adiabatic and render the thermodynamic identity inexact is by changing the phase of the working substance. The working substance can be made to do work by the phase change and at the end (penultimate step to be more precise) of the cycle have lower internal energy than at the start—the working substance forms its own virtual cold reservoir. The working substance can then be placed in contact with just the one reservoir to bring it back to the start co-ordinates.

First, consider the chemical potential's meaning: it is the thermodynamic potential per particle, $$du = Tds - pdV + \phi$$

where s and p are the entropy and pressure per particle. The chemical potential has two parts, the 'internal' and 'external'. The internal potential is defined as the chemical potential if an external potential is not present. If internal energy is to be extracted from the system, the expression for dU must be made inexact:

$$\delta u = Tds - pdV + \phi + \phi' \quad (A2.3)$$

Figure 11:
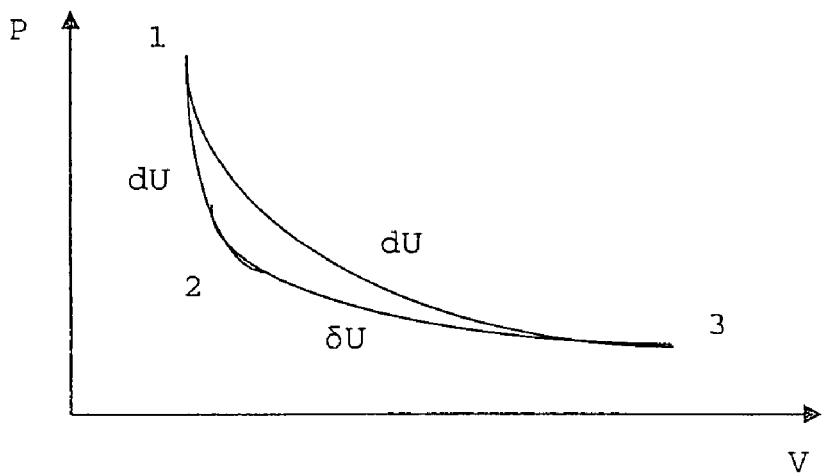
FIG. 11 shows a P-V diagram of a thermodynamic cycle in which the working substance undergoes a phase change.

A change of $\mu$ can only correspond to a phase change, as this will introduce potential energy terms $\phi'$ such as latent heat (1st order transition) or new magnetisation energy terms for instance (i.e. dipole work, 2nd order transition). It is almost as if a different substance is formed by the phase transition which then sweeps out a new path in P-V or H-I space, FIG. 11 illustrates this. Referring to FIG. 11:

At 1: Working substance in contact with reservoir
Step 1-2: Working substance expands adiabatically (or some other form of work, e.g. magnetic)
At 2: Working substance undergoes phase change and has formed its own virtual cold reservoir
Step 2-3: Expands adiabatically but follows a different path
At 3: Phase change
Step 3-1: Heat flow from reservoir to working substance along with phase change Thus, in this example, only one reservoir is needed.

This discussion will now take the concepts just presented into the area of theory pertinent to this disclosure and prior art. Before proceeding, it is noted that there is only magnetic field density 'B' in the 'microscopic' Maxwell equations; the magnetic field strength 'H' is merely a contrivance to make magneto-statics look like electro-statics. See Feynman, Section 36-2. However, to fit in with the view of working engineers that a magnetising field H causes magnetisation, M, of the working substance resulting in a flux: $B = \mu(H+M)$, this convention shall be used in this discussion where appropriate.

Along the lines of the independent flux criterion discussed in prior art, the classical dipole performing electrical work shall be discussed first. (Reference is made to Feynman about the sign of the dipole term. See Feynman, Sections 15-1, 6.) Consider the energy of a classical magnetic dipole in an external magnetic field:

$$E = +\mu \cdot B + const$$

Let the working substance collapse and generate a current in a solenoid that will act as the external field (i.e. the solenoid is preventing flux collapse). The magnetic moment can be eliminated and replaced with an expression in B (e.g., $\mu(B) = \chi B$, for convenience):

$$E = \epsilon_0 c^2 B^2 V \cos\theta + const$$

Taking the total differential of the expression and the power, the following can be obtained:

$$\Delta E = \frac{\partial E}{\partial B} dB + \frac{\partial E}{\partial \theta} d\theta \quad (A2.4)$$

$$\Rightarrow$$

$$\frac{dE}{dt} = \epsilon_0 c^2 BV\cos\theta \frac{dB}{dt} + \epsilon_0 c^2 B^2 V \left|\sin\theta \frac{d\theta}{dt}\right|$$

The first term represents the field energies of magnetization of the working substance and the external solenoid and is constant. The last term is the dipole work (or shaft work) and represents conversion of mechanical energy to electrical. The modulus sign is used to show work into a dissipative load. The first term is associated with the usual expression for magnetic work in thermodynamic texts:

$$\delta W = -\mu_0 H dM \quad (A2.5)$$

Earlier the magnetization (or the moment) was replaced by an expression in B via $\chi$. Of course 'H' is a 'B' field too. Straight away by the independent flux criterion and the second term of Equation (A2.4) it will be seen that another term has entered the thermodynamic reasoning over that in Equation (A2.5) given to the working substance in a conventional manner. See, e.g., Rosenweig. It shall be seen that the second term of Equation (A2.4) allows the working substance to cool and form its own virtual reservoir. Rosenweig develops expressions for the thermodynamic identity and entropy of magnetic materials along these lines:

$$M = M(H,T) \text{ where T is temperature}$$

From Equation (A2.5):

$$\delta W = -\mu_0 H \left[ \left( \frac{\partial 1 M}{\partial H} \right)_T dH + \left( \frac{\partial M}{\partial T} \right)_H dT \right] \quad (A2.6)$$

and $$\delta Q = c(H,T) dT + g(H,T) dH \quad (A2.7)$$

where c is the specific heat at constant H and g is a function at constant T. See Rosensweig, Section 6.1.

After consideration of the cross partial derivatives of the internal energy, U and the entropy, S, Rosenweig then derives these expressions:

$$g = \mu_0 T \left( \frac{\partial M}{\partial T} \right)_H \quad (A2.8)$$

$$\left( \frac{\partial c}{\partial H} \right)_T = \mu_0 T \left( \frac{\partial^2 M}{\partial^2 T} \right)_H \quad (A2.9)$$

The Langevin function gives the ratio of average magnetization to saturation magnetization at a given temperature and field by the theory of statistical mechanics:

$$\frac{\bar{m}}{m_s} = L\left(\frac{mH}{kT}\right) = \coth\left(\frac{mH}{kT}\right) - \frac{kT}{mH} \quad (A2.10)$$

See, e.g., Aharoni; Rosensweig; and Feynman.

Rosenweig then near the Curie point is able to linearize Equation (A2.10) and use relations (A2.7), (A2.8) and (A2.9) to derive the entropy of a material behaving paramagnetically or super-paramagnetically as:

$$S = c_0 \ln T - \mu_0 KH + const$$

with $$M = K(\theta_{Curie} - T)$$

and $$c(T) = c_0 \text{ since } (\partial c / \partial H)_T = 0 \quad (A2.11)$$

Figure 12:
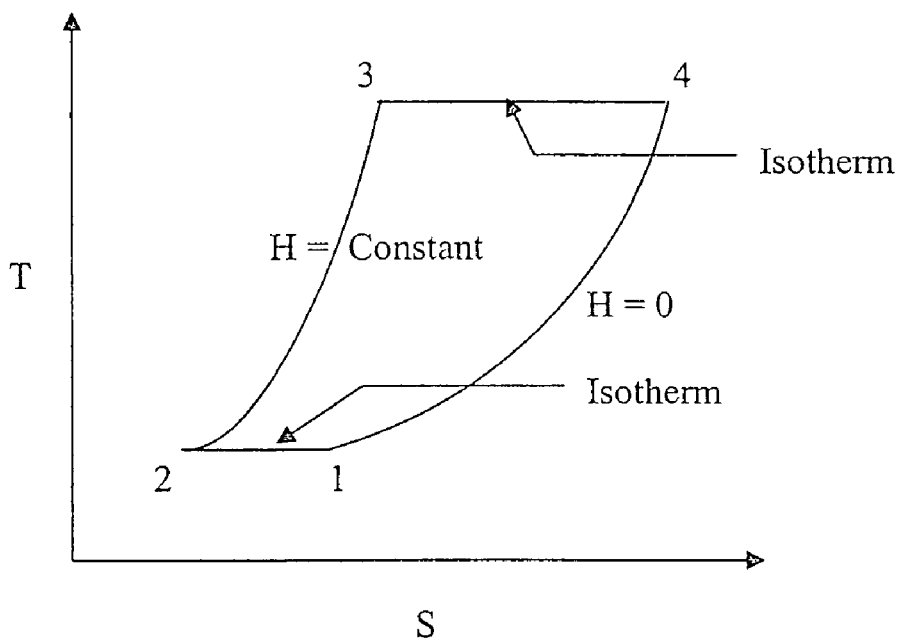
FIG. 12 shows a T-S diagram for a conventional magnetic heat engine.

This leads to the T-S diagram illustrated in FIG. 12 for a conventional magnetic heat engine.

In contrast to an ideal gas heat engine, the sections between the adiabatics don't happen at constant entropy. This is due to the term $\mu_0 KH$ in Equation (A2.11) as this term represents the ordering of the dipoles by the magnetic field and the magneto-calorific effect. The non-isothermal sections in FIG. 12 are logarithmic curves.

Moving now to exemplary devices embodying aspects of the disclosed technology, it is noted that the ferrofluid is operated well below the Curie temperature. Nether-the-less cycles operating at elevated temperature can be devised but will just result in less efficient performance when used in the configuration of the cycle described herein. This is due to a lower saturation moment at elevated temperature. Needless to say, the magneto-calorific effect is not important in the new cycle. Also, it is noted that ferrofluids display intrinsic (Néel type) and extrinsic (Brownian type) super-paramagnetism. See, e.g., Aharoni; Rosensweig.

Figure 1A:
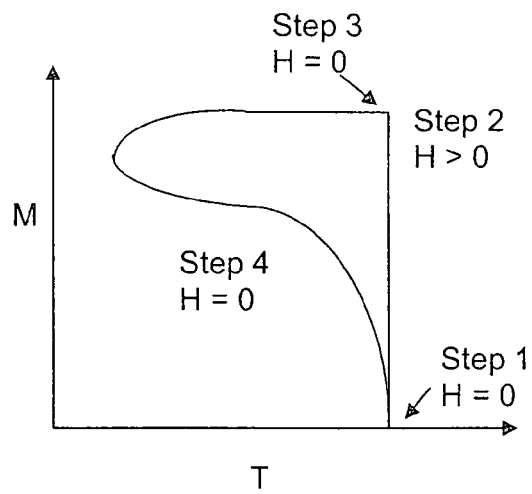
FIG. 1A shows a magnetisation-temperature (M-T) diagram in a small region near a ferrofluid particle for one cycle.
Figure 1B:
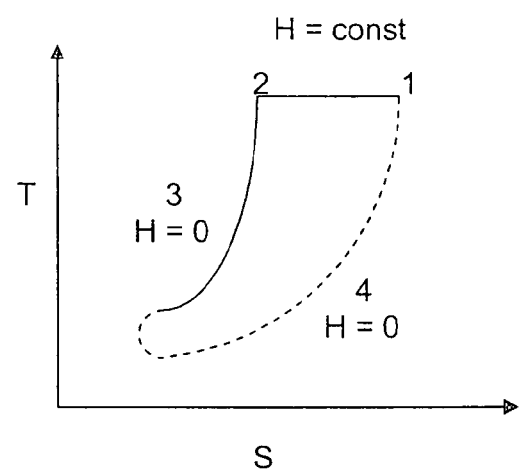
FIG. 1B shows a temperature-entropy (T-S) diagram in a small region near a ferrofluid particle for one cycle.

FIG. 1a represents a local view, that is, near a particle of the ferrofluid within a shell of a few particle radii of magnetisation versus temperature. FIG. 1b under the same local argument shows the temperature-entropy diagram.

More specifically, FIG. 1a is a local view within a few radii of the ferrofluid particle for a one-shot cycle. After step 3 the ferrofluid performs electrical work and the region near a ferrofluid particle cools adiabatically on a short time scale near it after the fluid carrier particles surrender their thermal energy. On a longer time scale heat energy from the bulk of the liquid flows into this region raising its temperature (step 4).

FIG. 1b shows a local temperature entropy diagram. From 1-2 the field is applied. As mentioned earlier the cycle operates well below the Curie point so there is little change in temperature when the field is applied—the ferrofluid particle concentration is so low compared to the liquid that decrease of their entropy contribution does not significantly alter the temperature. FIG. 1b is devoid of the time variable and it can be said that process 1-2 could cause a temperature rise by a frequency dependent entropy generating term in Equation (A2.11), if the field is switched on faster than the relaxation rate of the fluid. The frequency performance of ferrofluid was discussed earlier in the document as being approximated by a first order pole.

Figure 13:
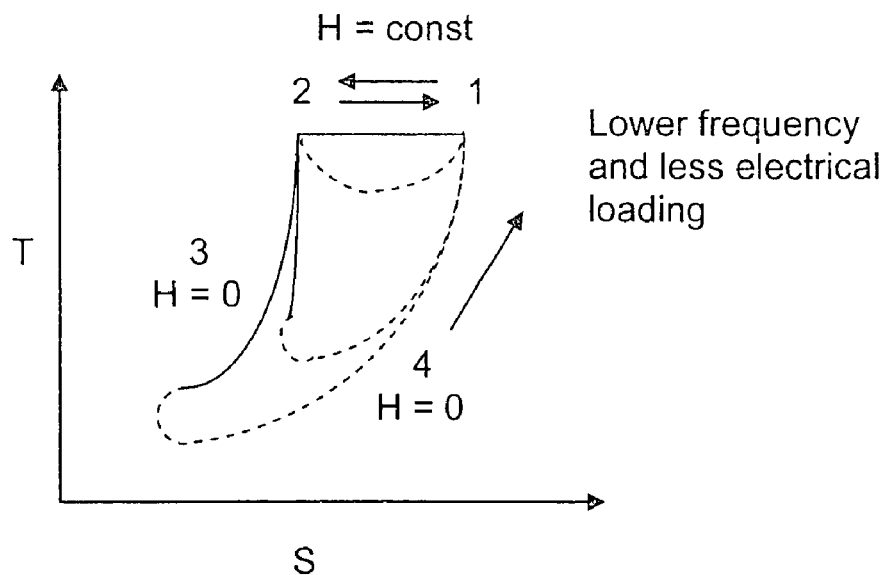
FIG. 13 is another T-S diagram illustrating features of the disclosed technology.

Another term that is desirably added to Equation (A2.11) is the reduction in entropy by electrical work from the second term of Equation (A2.4). Once again this is a frequency and electrical load dependent effect. FIG. 13 shows that with no electrical loading or very slow operation that the trajectory traced by steps 3 and 4 is just 2-1 in reverse in the limit.

Figure 1C:
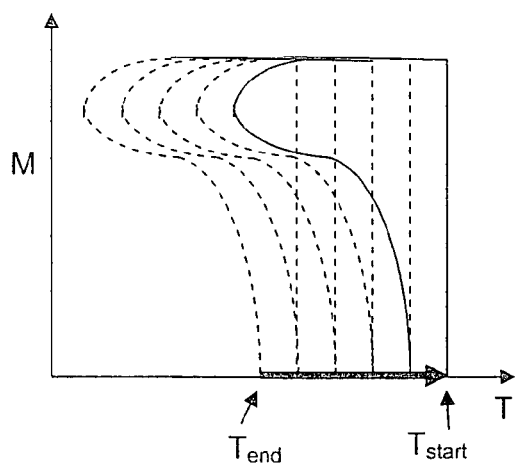
FIG. 1C shows an M-T diagram in a small region near a ferrofluid particle for several cycles.
Figure 1D:
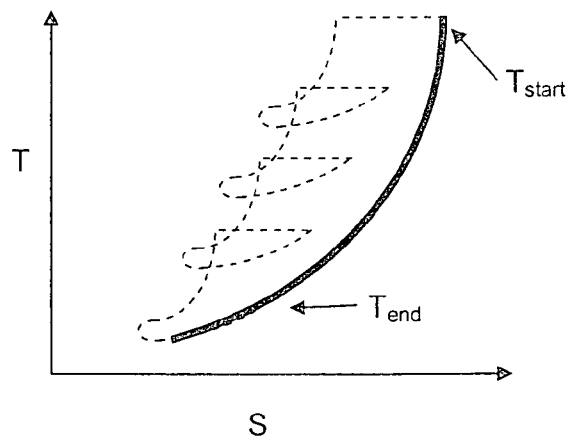
FIG. 1D shows a T-S diagram in a small region near a ferrofluid particle for several cycles.
Figure 14:
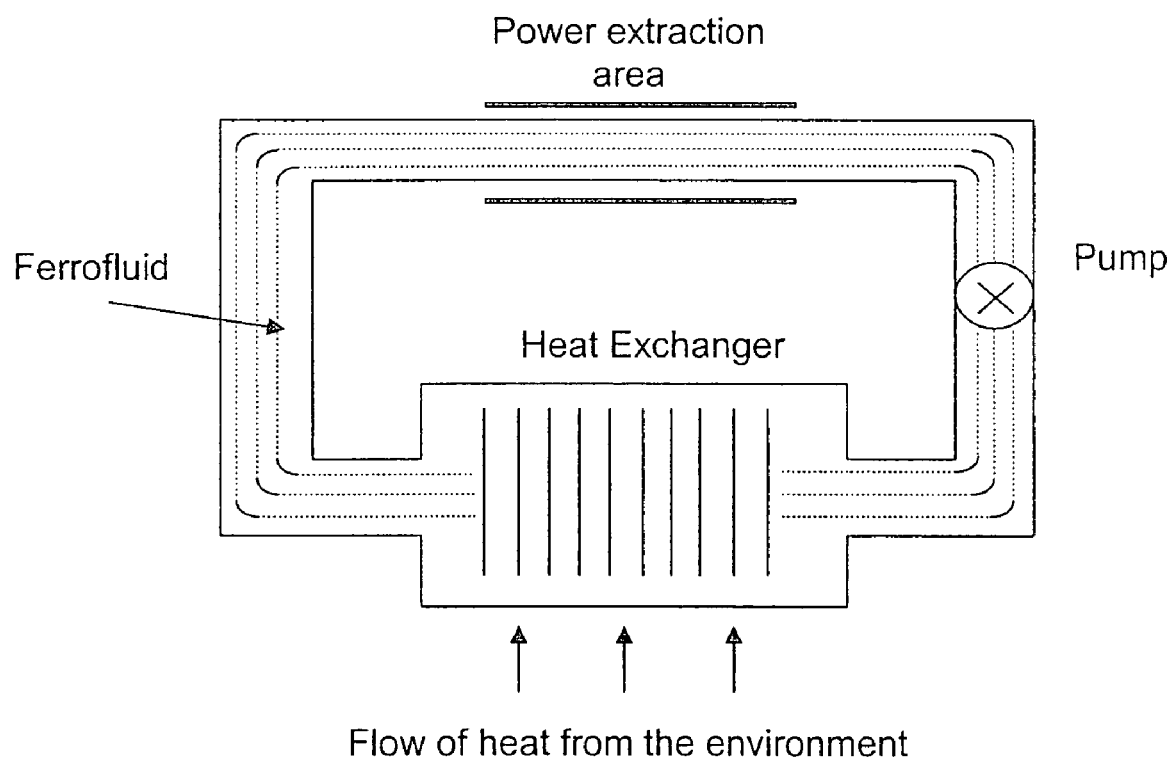
FIG. 14 is block diagram showing an exemplary system for performing aspects of the disclosed technology.

Finally for more clarity of the process it is noted that the ferrofluid is part of an overall plant and process, such as that illustrated in FIG. 14. In the power extraction area of FIG. 14, the ferrofluid will undergo many cycles and so shown below is the local view point (within a few radii of the ferrofluid particles) over several cycles. FIG. 1c shows the magnetisation-temperature diagram and FIG. 1d shows the temperature-entropy diagram for many cycles in the power extraction area. The ferrofluid exiting the power extraction area is cooler and shown in solid line on the graphs is a global view point connecting the start and end of the local, high cycle frequency 'micro-state' trajectories with the slow, global cycle via the heat exchanger.

What is claimed is:

1. An apparatus for performing a thermodynamic cycle, comprising:
    a sample that exhibits temporary magnetic remanence; and
    a magnetisation apparatus for magnetising the sample, wherein the magnetisation apparatus is operable, during a first part of the thermodynamic cycle, to produce a cyclically-varying magnetising field comprising a wavetrain of a plurality of consecutive cycles, and to remove the magnetising field from the sample during a second part of the thermodynamic cycle, wherein demagnetisation of the sample during the second part of the thermodynamic cycle causes the generation of an independent magnetic flux.

2. An apparatus according to claim 1, wherein the cyclically-varying magnetising field is a substantially sinusoidally-varying magnetising field.

3. An apparatus according to claim 2, wherein the magnetising field produces a substantially sinusoidally-varying magnetic flux in the sample.

4. An apparatus according to claim 1, wherein the sample is a ferrofluid or ferroset with heat conduction channels therethrough.

5. An apparatus according to claim 1 wherein the wavetrain comprises at least five consecutive cycles of the magnetising field.

6. An apparatus according to claim 1 wherein the wavetrain comprises at least ten consecutive cycles of the magnetising field.

7. An apparatus according to claim 1, wherein the magnetisation apparatus also comprises a power collection apparatus, in which power is generated during the second part of the thermodynamic cycle by the independent magnetic flux.

8. A method of convening energy, comprising the steps of:
providing a sample that exhibits temporary magnetic remanence;
magnetising the sample, during a first part of a thermodynamic cycle, by producing a cyclically-varying magnetising field comprising a wavetrain of a plurality of consecutive cycles; and
removing the magnetising field from the sample during a second part of the thermodynamic cycle, thereby allowing the sample to demagnetise, the demagnetisation of the sample causing the generation of an independent magnetic flux.

9. A method according to claim 8, further comprising the step of convening at least some of the independent magnetic flux into an electric current.

10. An apparatus for performing a thermodynamic cycle, comprising:
a sample that exhibits temporary magnetic remanence; and
a magnetisation apparatus for magnetising the sample, wherein the magnetisation apparatus is operable, during a first part of the thermodynamic cycle, to produce a substantially sinusoidally-varying magnetising field, thus producing a substantially sinusoidal variation of magnetic flux in the sample, and to remove the magnetising field from the sample during a second part of the thermodynamic cycle,
wherein demagnetisation of the sample during the second part of the thermodynamic cycle causes the generation of an independent magnetic flux.

11. An apparatus according to claim 10, wherein the sample is a ferrofluid or a ferroset with heat conduction channels therethrough.

12. A method of converting energy, comprising the steps of:
providing a sample that exhibits temporary magnetic remanence;
magnetising the sample, during a first part of a thermodynamic cycle, by producing a substantially sinusoidally-varying magnetising field, thus producing a substantially sinusoidal variation of magnetic flux in the sample; and
removing the magnetising field from the sample during a second part of the thermodynamic cycle, thereby allowing the sample to demagnetise, the demagnetisation of the sample causing the generation of an independent magnetic flux.

13. A method according to claim 12, further comprising the step of converting at least some of the independent magnetic flux into an electric current.

* * * * *

UNITED STATES PATENT AND TRADEMARK OFFICE
CERTIFICATE OF CORRECTION

PATENT NO. : 7,746,203 B2
APPLICATION NO. : 11/809330
DATED : June 29, 2010
INVENTOR(S) : Remi Oseri Cornwall It is certified that error appears in the above-identified patent and that said Letters Patent is hereby corrected as shown below:

In the Specification:

Column 5, line 5, "determine $\zeta_f'$ and the" should read --determine $B_f$ and the--.

Column 9, lines 20-24, "after eliminating

V: $\eta = \dfrac{Q_H - Q_L}{Q_H} = 1 - \dfrac{T_L}{T_H}$ " should read

--after eliminating V:

$\eta = \dfrac{Q_H - Q_L}{Q_H} = 1 - \dfrac{T_L}{T_H}$ --.

Column 11, line 25, Equation (A2.6), " $\delta W = -\mu_0 H \left[ \left(\dfrac{\partial M}{\partial H}\right)_T dH + \left(\dfrac{\partial M}{\partial T}\right)_H dT \right]$ ,"

should read -- $\delta W = -\mu_0 H \left[ \left(\dfrac{\partial M}{\partial H}\right)_T dH + \left(\dfrac{\partial M}{\partial T}\right)_H dT \right]$ --.

Signed and Sealed this
Fifth Day of June, 2012

David J. Kappos
*Director of the United States Patent and Trademark Office*